United States Patent

[11] 3,599,116

[72] Inventors Hilton W. Spence
Richardson;
Ralph O. Bohannon, Richardson; Edward
N. Jeffrey, Plano, all of, Tex.
[21] Appl. No. 742,730
[22] Filed July 5, 1968
[45] Patented Aug. 10, 1971
[73] Assignee Texas Instruments Incorporated
Dallas, Tex.

[54] LIGHT SENSITIVE SIGNAL GENERATOR
4 Claims, 8 Drawing Figs.

[52] U.S. Cl. .................................................. 331/113 R, 331/66
[51] Int. Cl. .................................................. H03k 3/282
[50] Field of Search .................................................. 331/113, 66

[56] References Cited
UNITED STATES PATENTS

| | | | |
|---|---|---|---|
| 3,253,153 | 5/1966 | Stoddard | 331/66 |
| 3,251,004 | 5/1966 | Shombert et al. | 331/66 |
| 3,268,732 | 8/1966 | Grieder | 331/66 |
| 3,253,596 | 5/1966 | Keller, Jr. | 331/113 |

OTHER REFERENCES

R.J.P. Jones, Electronic Engineering " A Wide Frequency Range Voltage Controlled Multivibrator pgs. 14— 15, Jan. 1967 331— 113

*Primary Examiner*—John Kominski
*Attorneys*—Samuel M. Mims, Jr., James O. Dixon, Andrew M. Hassell, Harold Levine, Melvin Sharp, Gerald B. Epstein, John E. Vandigriff and Richards, Harris and Hubbard

ABSTRACT: A circuit for producing an electrical signal proportional to light intensity having two amplifiers interconnected in a multivibrator configuration. The timing circuit of one amplifier is a standard RC circuit and in the second a photodiode. In one configuration, the amplifiers including associated transistors, resistors and capacitors along with a light sensitive diode are fabricated as an integrated circuit on a monolithic substrate. Because the device responds to light in the visible range which is absorbed close to the incident surface of silicon, the diffused diode must be as thin as possible to obtain the desired high light current. A process for fabricating the light sensitive diode and associated circuitry includes the step of a dilute deposition of phosphorous oxytrichloride for the transistor emitter. Special processing techniques are employed to minimize thermal shock and dislocations.

Figure 1:
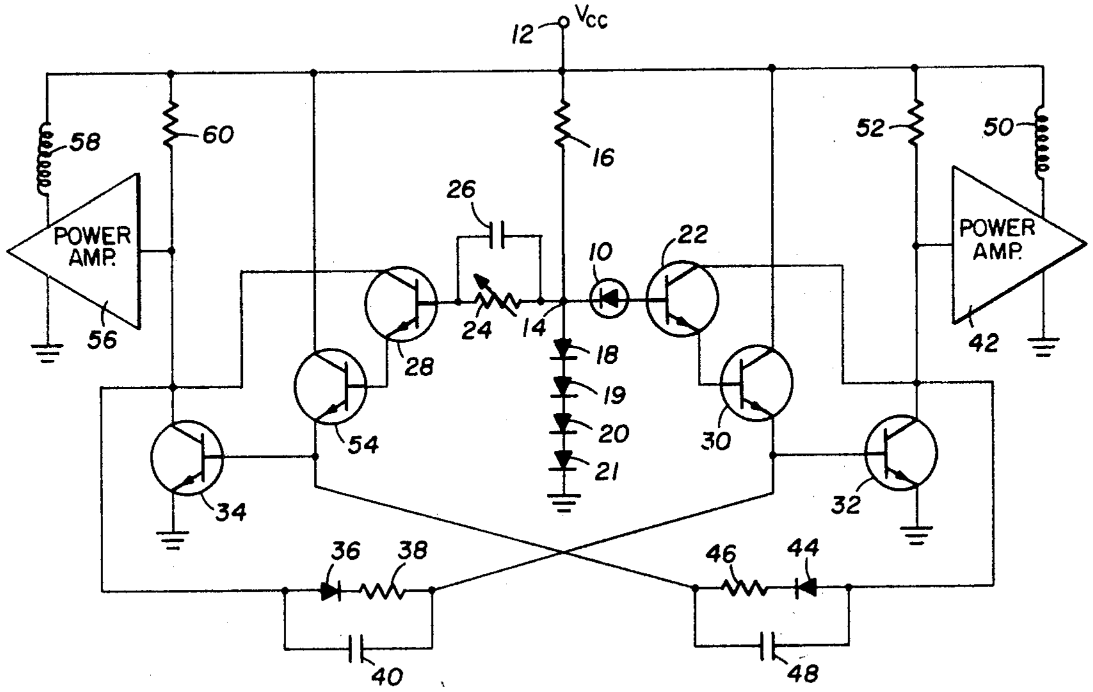

INVENTORS:
RALPH O. BOHANNON
EDWARD N. JEFFREY
HILTON W. SPENCE

Harold E. Meier
ATTORNEY (RIGHT SECTION)

(LEFT SECTION)

INVENTORS
RALPH O. BOHANNON
EDWARD N. JEFFREY
HILTON W. SPENCE
Harold C. Meier
ATTORNEY

LIGHT SENSITIVE SIGNAL GENERATOR

This invention relates to a signal generator responsive to light intensity, and more particularly, to an integrated circuit light sensitive signal generator having a photodiode and transistor circuitry formed simultaneously on a single wafer.

Heretofore, only limited success has been achieved in fabricating a light sensitive integrated circuit for producing desired optoelectronic function. Previously, such functions were achieved by using cadmium sulfite cells and galvanometer-type electromechanical devices.

Although the idea of combining a light sensitive PN diode into an integrated circuit configuration has been suggested previously, it has been been possible using integrated circuit techniques due to the absorption of visible light near the surface and the difficulty of forming the information into usable energy. Primarily, the problem was that of developing a circuit for using the relatively low magnitudes of photocurrent generated by silicon PN junctions responsive to light in the visible region. Also, previous integrated circuit processing techniques were inadequate to produce photodiodes in an integrated circuit configuration having the desired light and dark current characteristics.

In accordance with the present invention, the magnitude of incident visible light flux is converted into electronic fluctuations having a frequency proportional to the intensity of incoming light. Basically, incident light is converted into frequency fluctuations by means of a photodiode operated in a reversed bias condition and included as the timing circuit of one amplifier of a free-running multivibrator. The free-running multivibrator includes a second amplifier having the time constant determined by an RC timing circuit.

In accordance with another aspect of this invention, a signal proportional to light intensity is generated by a circuit wherein the transistors, capacitors, and resistors of a free-running multivibrator are formed simultaneously with a photodiode. This circuit utilizes a large area PN junction sensitive to light in the visible region fabricated simultaneously with associated circuitry in the same silicon substrate. Each of the two amplifiers of the free-running multivibrator comprises several stages of transistor amplification. The first transistor of each amplifier, that is, the one coupled to the photodiode, preferably has good $h_{FE}$ characteristics at low current levels.

The shallow junctions necessary for proper photodiode efficiency make processing techniques in an integrated circuit configuration of this invention of utmost importance as surface conditions are more significant than in deeper junctions. Since the absorption coefficient in the 0.35 to 0.7-micron wavelength region is quite high, to achieve good light collection efficiency the diffused P-layer of the photodiode should be as thin as possible since most of the light in the visible range will be absorbed close to the surface. In addition to good collection efficiency, the fabricating techniques must produce a diode having a low-reverse saturation current and a high signal-to-noise ratio.

A process for producing a photodiode and a multivibrator in integrated circuit form includes steps to minimize surface stressing of the material. This necessitates careful handling between the relatively high temperatures of the diffusing steps and the lower temperature deposition steps.

To obtain a desired optoelectronic function, it is an object of this invention to provide a signal generator producing a fluctuating output varying in accordance with visible light intensity. Another object of this invention is to provide a signal generator for producing a desired optoelectronic function using a photodiode as a timer of a multivibrator circuit. Still another object of this invention is to provide a signal generator for producing a desired optoelectronic function wherein a photodiode and associated amplifier circuitry are formed simultaneously.

An additional object of this invention is to provide a signal generator for producing a desired optoelectronic function in a monolithic circuit configuration. A further object of this invention is to provide a process for producing a signal generator in a monolithic circuit configuration.

A better understanding of the invention and its advantages will be apparent from the specification and claims and from the accompanying drawings illustrative of the invention.

Figure 3:
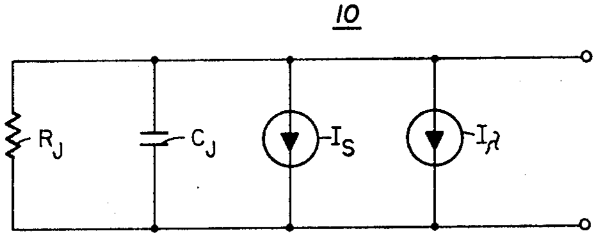
Figure 2:
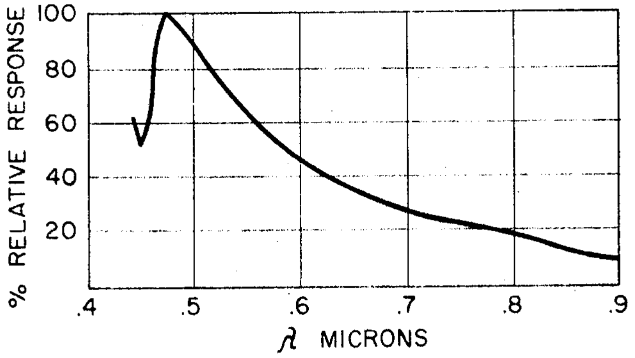
Figure 4:
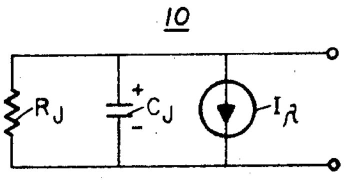
Figure 5A:
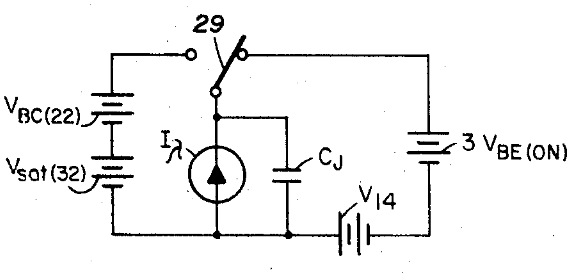
Figure 5B:
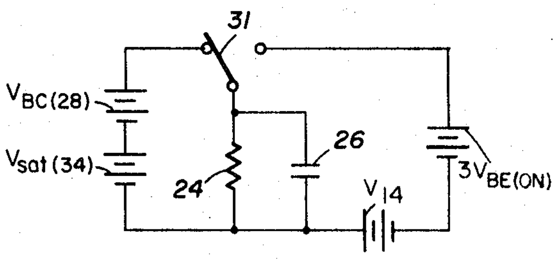
Figure 6:
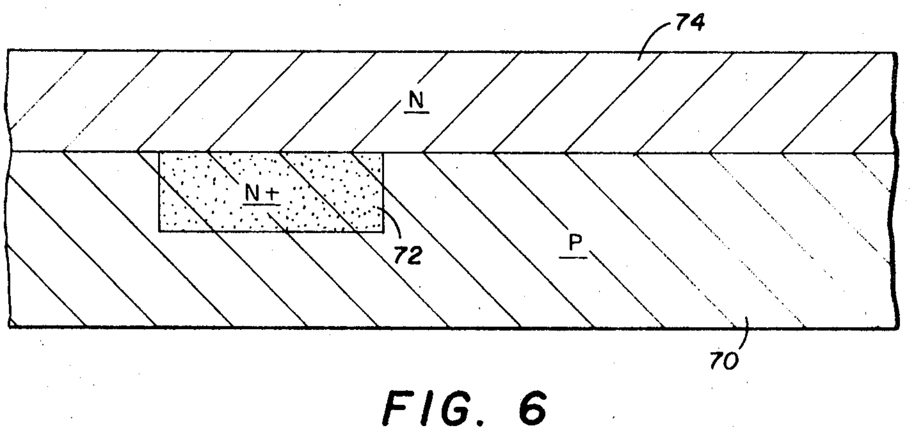
Figure 7:
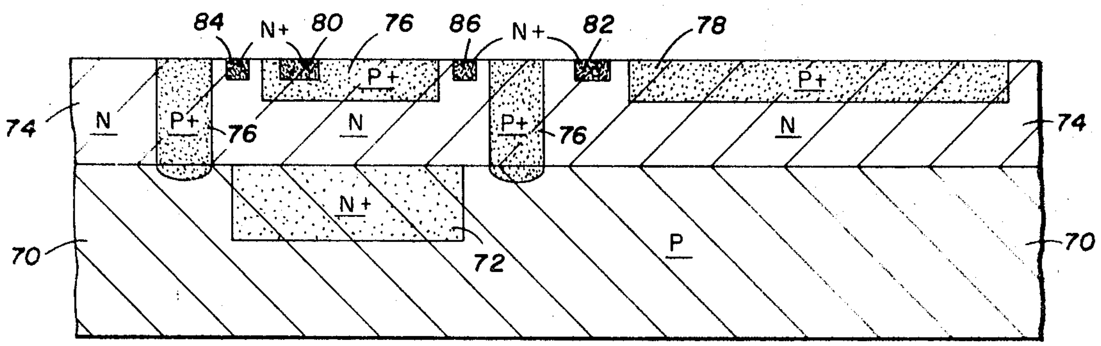

Referring to the drawings:

FIG. 1 is a schematic of a modified multivibrator employing a photodiode as a timer in one amplifier, FIG. 2 is a plot of percent relative response versus wavelength in microns, FIG. 3 illustrates the equivalent circuit for the photodiode of FIG. 1, FIG. 4 illustrates the equivalent circuit of a charged photodiode, FIGS. 5*a* and 5*b* illustrate schematically equivalent circuits for the multivibrator of FIG. 1, FIG. 6 is a schematic sectional view illustrating a buried layer starting material of a light sensitive integrated circuit, and FIG. 7 is a schematic illustration of a monolithic circuit fabricated in accordance with the present invention.

Referring now to the drawings, in FIG. 1 there is shown a circuit for producing a voltage output having a period of oscillation proportional to the visible light intensity incident on a photodiode 10.

Referring to FIG. 2, there is shown a plot of percent relative response versus wavelength in microns for a typical PN junction photodiode for use with the circuit of this invention. Normally a PN junction photodiode has a peak sensitivity well into the infrared region (about 7 $\mu$). However, a shallow depth PN junction fabricated by the process to be described has a peak region in the visible region (between 4 and 5 $\mu$).

A direct current supply (not shown) connected to the bias terminal 12 provides power for energizing the various circuit components and establishes a reference voltage at terminal 14 by means of a resistor 16 and a series circuit of four diodes 18 through 21 connected to ground. The voltage at terminal 14 will always be more positive than the voltage at the base electrode of a transistor 22 thus reverse biasing the diode 10 during all operating conditions of the circuit. An RC timing circuit consisting of a variable resistor 24 in parallel with a capacitor 26 also connects to the terminal 14 and provides a base drive for a transistor 28.

The light generated signal current from the diode 10 is on the order of nanoamperes which necessitates that the transistor 22 have good $h_{FE}$ characteristics. This current is amplified by the transistor 22 and a transistor 30 connected in a series circuit configuration. The output signal at the emitter electrode of the transistor 30 provides a temporary base drive signal to a switching transistor 32. A blocking circuit consisting of a series combination of a diode 36 and a resistor 38 in parallel with a capacitor 40 blocks loss of this temporary signal through the transistor 34 which is operating in a saturated condition.

Conduction of the transistor 32 removes the sustaining base current to the transistor 34 through a blocking circuit consisting of a diode 44 in series with a resistor 46, both of which are in parallel with a capacitor 48. Regeneration now takes place and the conduction state of the transistors 32 and 34 reverses. The low voltage level at the collector electrode caused by conduction of the transistor 32 also forward biases the collector-base junction of the transistor 22, thereby removing the light generated signal current from the base of transistor 30.

A power amplifier 42 generates a current signal as a result in the change of conduction of the transistor 34 through an output coil 50 connected to the terminal 12. A collector bias resistor 52, connected to the transistor 32, and the collector electrode of the transistor 30 are also coupled to the terminal 12 to provide a bias voltage for the transistors 30 and 32.

In the usual manner, the multivibrator of this invention includes two similar amplifiers, the left half of the circuit in FIG. 1 is similar to the right half described above. Thus, the left section includes the transistor 28 in a series circuit configuration with a transistor 54 which in turn operates in series with the transistor 34. A change in conduction of the transistor 34 generates a change in the input signal to a power amplifier 56. A second output signal, having the reverse polarity of the signal generated at the output coil 50, will be generated by the power amplifier 56 at an output coil 58. The output coil 58, along with a collector bias resistor 60, and the collector electrode of the transistor 54 are interconnected to the terminal 12.

In operation, assume the transistor 34 is and maintained in this state by means of a current flow through the diode 44 and resistors 46 and 52. The voltage at the base of transistor 28 equals the saturation voltage, $V_{sat(34)}$, of the transistor 34, plus the collector-to-base voltage, $V_{BC(28)}$, of the transistor 28. The capacitor 26 charges to a level equal to the difference between the voltage at terminal 14 (equal to the four forward voltage drops of the diodes 18—21) and the voltage at the base of transistor 28 ($V_{sat(34)}+V_{BC(28)}$). Charging the capacitor 26 will be completed in a relatively short period of time due to the low impedance of the conduction path. During the conducting cycle of the transistor 34, an output signal will be generated at the output coil 58.

Transistor 34 continues to conduct until interrupted by conduction of the transistor 32. Conduction of the transistor 32 interrupts the holding current to the base electrode of the transistor 34 thereby causing regeneration and establishing a normal bias condition for the transistor 28. As mentioned previously, regeneration caused by conduction of the transistor 32 turns off conduction through the transistor 34. A sustaining base current is supplied to the transistor 32 through the resistor 60 and the blocking circuit of diode 36, resistor 38, and capacitor 40.

Capacitor 26 now begins to discharge through the resistor 24 and continues to discharge until the voltage at the base electrode of the transistor 28 equals the sum of the base emitter turn on voltages of the transistors 28, 34 and 54. When this voltage level has been attained the transistor 34 is again turned on thereby interrupting the holding current to the transistor 32.

Operation of the right section of the circuit of FIG. 1 is similar to that described above with the exception that the RC circuit comprising the resistor 24 and capacitor 26 has been replaced with the photodiode 10. Referring to FIGS. 3 and 4, there is shown an equivalent circuit model of a reversed biased photodiode with visible light incident thereon; the saturation current is given by $I_s$ and the photocurrent by $I_\lambda$. During conduction of the transistor 32, the voltage at the base electrode of transistor 22 will be equal to the saturation voltage of the transistor 32 plus the forward collector-base voltage of the transistor 22.

Capacitor $C_J$ (the capacitance of the photodiode 10) will be charged to the difference between the sum of the forward conducting voltage of the diodes 18—21 and the base voltage of transistor 22. This condition is shown in FIG. 4. The capacitor $C_J$ remains in a charged condition so long as the transistor 32 conducts. Removing the holding current from the transistor 32 causes the capacitor $C_J$ to discharge through a resistor $R_J$ (the parallel resistance of the photodiode 10). This operation duplicates in many respects that described previously with regards to the discharge of the capacitor 26 through the resistor 24.

While the capacitor $C_J$ is being discharged, the transistors 22, 30 and 32 are in an "off" condition. These transistors will again go into a conducting state when the voltage at the base electrode of transistor 22 equals the sum of the base-emitter turn-on voltages of the transistors 22, 30 and 32. That is, when the capacitor $C_J$ discharges to this level. The discharge time of the capacitor $C_J$ will be an indirect function of the photocurrent $I_\lambda$ as given by the expression:

$$t_1=C_J(3V_{BE}-V_{BC(22)}-V_{sat(32)}/I_\lambda \qquad (1)$$

where $3V_{BE}$ equals the sum of the base-emitter turn on voltages of the transistors 22, 30 and 32;

$V_{BC(22)}$ is the base-to-collector diode drop of the transistor 22; and $V_{sat(32)}$ equals the saturation voltage of the transistor 32.

Referring to FIGS. *5a* and *5b*, there is shown equivalent circuits for the two amplifier sections of the multivibrator of FIG. 1. FIG. *5a* represents the right secton of the circuit and illustrates existing conditions when transistor 32 is nonconducting. The capacitor $C_J$ discharges during this operation to a level equal to the voltage at terminal 14 less the base-to-emitter turn on voltage of the transistors 22, 30 and 32 [$3V_{BE(on)}$]. While the capacitor $C_J$ is discharging, the capacitor 26 will be charging as indicated in FIG. *5b*. As stated, the charge will be equal to a difference between the saturation voltage, $V_{sat(34)}$, of the transistor 34 plus the forward base-collector voltage of the transistor 28, $V_{BC(28)}$, and the diode regulation voltage at terminal 14. During a subsequent cycle, the switches 29 and 31 of the equivalent circuits of FIGS. *5a* and *5b* would be reversed. Thus, the photodiode 10 and the RC circuit including the resistor 24 and the capacitor 26 provide a free running multivibrator with a first time constant $t_1$ varying as a function photocurrent $I_\lambda$, and a second time constant $t_2$ being determined by the resistor 24 and the capacitor 26.

Preferably, the circuit of FIG. 1 including the photodiode 10 is simultaneously formed as a monolithic circuit fabricated in accordance with the present invention by a process illustrated in FIGS. 6 and 7. Since the photodiode capacitance is preferably low, the starting material may be a P-type silicon substrate having a resistivity of 10 to 15 ohms-centimeter with an $N^+$ "buried layer" below the transistor areas only. An epitaxially grown layer of silicon 74 (about 4 to 5 microns thick and having a resistivity of 4 to 6 ohm-centimeters) extends over the entire surface of the substrate 70 including the buried region 72.

The thickness of the expitaxial layer 74, as well as the transistor geometry, largely determines the saturation voltage of the circuit transistors, which is an important circuit consideration as discussed previously.

All the processing steps to be described include conventional diffusion techniques in that silicon dioxide is used as a diffusion mask and is patterned by conventional photolithographic techniques. Silicon dioxide layers for each succeeding diffusion are grown during the preceding diffusion step. Accordingly, the masking process associated with each step will not be described in detail. The silicon dioxide film is grown following the epitaxial layer growth by a standard thermo-oxidation technique wherein the wafer will be exposed to an atmosphere of steam for 30 minutes while heated to about 1,200° C.

Following the oxidation of the epitaxial layer 74, the next step in the process is the deposition and diffusion of a P-type material in the areas necessary to form the isolation rings 76 around each of the circuit components. This diffusion is typically a standard boron diffusion using boron tribromide ($BBr_3$) as the impurity source. The deposition step is carried out at about 1,150° C. and includes a 5-minute prepurge, a 30-minute deposition, and 5-minute after purge. The substrate is then placed in a diffusion furnace having a steam atmosphere and heated to about 1,250° for about 35 minutes, to diffuse the impurities. In the usual manner, this step is carried out by placing the wafer in a quartz carrier, or boat, which is pushed into the hot zone of a furnace. A lightweight boat or carrier must be used throughout this process to minimize thermal shock and reduce the possibility of dislocations. Minimizing the thermal shock and reducing the dislocations is of particular importance since these effects have a direct bearing on the leakage current level of the photodiode. The shallow junctions necessary for proper photodiode efficiency make processing techniques at this point of utmost importance as surface conditions are more significant than in deeper junctions.

Next, the P-type base region 76 and the P-type anode region 78 of the diode 10 are diffused, This is again a boron diffusion which may be performed from boron tribromide ($BBr_3$) with the deposition being made of 950 ° C. for a period of 15 minutes. After a deglaze, the substrate is placed in a diffusion furnace and heated to 1,050° C. in an oxygen atmosphere for 5 minutes, a steam atmosphere for 40 minutes, and a nitrogen atmosphere for 5 minutes. Also diffused at this time, but not shown in FIGS. 6 and 7, are the various resistors, capacitors, and junction diodes of the circuit shown in FIG. 1.

Finally, the emitter region 80, the cathode contact region 82 of the photodiode 10, and the emitter-base capacitors 84 and 86 are deposited and diffused from phosphorous oxytrichloride ($POCl_3$) at 975° C. for 15 minutes, preceded and followed by a nitrogen purge. An important feature of the process of this invention is the diluted phosphorous oxytrichloride deposition and diffusion of this step. Typically, the carrier gas (or $POCl_3$) diffusion is a mixture of oxygen and source nitrogen in the ratio of 1 to 1 (200 cc./min.). However, to form the shallow depth diffusion required for the circuit of FIG. 1, the carrier gas is a mixture of about 200 cc./min. of oxygen and 30 to 50 cc./min. of source nitrogen. This diluted diffusion also has the effect of reducing leakage currents.

At this point, the diffusions are substantially at their final depths and final sheet resistances, because the two final processing steps are at relatively low temperatures for relatively short periods of time. The base region 76 has a sheet resistance of about 300 ohms per square at a depth of about 2.5 to 3 lines; and the emitter region 80 has a depth of about 2 lines (1 line $\approx 0.27 \mu m$).

After all diffusion steps have been completed, a pyrolytic oxide layer having a thickness in the range of from2000 to 3000 A. is formed over the wafer. This layer may be formed by placing the wafer in a furnace maintained at a temperature of about 450° C. with an oxidant, such as oxygen gas or stream. Openings are now cut in the oxide by a photoresist technique in the areas where ohmic contacts are to be formed. After the wafer has been again cleaned, it is placed in a vacuum evaporation chamber and the ohmic contact metal vaporized onto the wafer by a heated filament. The metallized wafer is again coated with photoresist, exposed through a mask defining the contacts, and developed. An appropriate etch, such as sodium hydroxide, removes and unwanted metal to define contacts to the various electrical components.

While only one embodiment of the invention, together with modifications thereof, has been described in detail herein and shown in the accompanying drawings, it will be evident that further modifications are possible without departing from the scope of the invention.

We claim:

1. A light sensitive signal generator including a free-running multivibrator circuit wherein the frequency thereof is variable in proportion to light impinging upon a photodiode, comprising in combination:

a. first and second switching transistors, each having a collector electrode coupled to a voltage source, an emitter electrode coupled to a first reference source, and a base electrode;

b. first and second blocking circuits connecting said first and second base electrodes respectively to said second and first collector electrodes;

c. circuit means including a resistor and at least one diode series-connected between said voltage source and said first reference source for producing a second reference source at the junction of said resistor and diode;

d. a first timing circuit for producing a first timing signal including a series-connected photodiode and at least one coupling transistor connected between the base electrode of said first switching transistor and said second reference source junction, said photodiode having an RC time constant variable in proportion to light impinging thereon; and e. a second timing circuit for producing a second timing signal including a parallel-connected RC circuit series-connected to at least one coupling transistor, said second timing circuit being connected between the base electrode of said second switching transistor and said second reference source junction; wherein f. said first timing signal being proportional to light impinging upon said photodiode, and said second timing signal being proportional to the value of said parallel-connected Rc circuit; and wherein g. said timing signals respectively cause said first and second switching transistors to change between high and low conductive states with the duty cycle of each switching transistor being respectively determined by said timing signals, thereby producing a signal generator having a frequency that is variable in proportion to light impinging upon said photodiode.

2. The signal generator of claim 1 and further including first and second power amplifiers respectively coupled to said collector electrodes of said switching transistors for respectively producing first and second variable frequency signals substantially 180° phase-shifted with respect to each other.

3. The signal generator of claim 1 wherein each of said blocking circuits includes a parallel-connected resistor and capacitor and a diode series-connected to said resistor and parallel-connected to said capacitor.

4. The signal generator of claim 1 wherein the resistor of said second timing circuit is variable for varying the RC time constant thereof.